(12) United States Patent
Cheng et al.

(10) Patent No.: US 11,164,774 B2
(45) Date of Patent: Nov. 2, 2021

(54) INTERCONNECTS WITH SPACER STRUCTURE FOR FORMING AIR-GAPS

(71) Applicant: International Business Machines Corporation, Armonk, NY (US)

(72) Inventors: Kenneth Chun Kuen Cheng, Albany, NY (US); Koichi Motoyama, Clifton Park, NY (US); Chanro Park, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/744,912

(22) Filed: Jan. 16, 2020

(65) Prior Publication Data
US 2021/0225691 A1 Jul. 22, 2021

(51) Int. Cl.
*H01L 21/768* (2006.01)
*H01L 23/522* (2006.01)
*H01L 23/532* (2006.01)

(52) U.S. Cl.
CPC .... *H01L 21/7682* (2013.01); *H01L 21/76802* (2013.01); *H01L 21/76837* (2013.01); *H01L 21/76877* (2013.01); *H01L 23/5226* (2013.01); *H01L 23/5329* (2013.01)

(58) Field of Classification Search
CPC ........... H01L 21/76897; H01L 21/7682; H01L 21/76816; H01L 21/76831
See application file for complete search history.

(56) References Cited

U.S. PATENT DOCUMENTS

| | | | |
|---|---|---|---|
| 4,536,951 A | 8/1985 | Rhodes et al. | |
| 5,098,856 A * | 3/1992 | Beyer | H01L 21/764 257/E21.573 |
| 5,693,568 A | 12/1997 | Liu et al. | |
| 6,444,565 B1 | 9/2002 | Feild et al. | |
| 7,396,732 B2 | 7/2008 | Kunnen | |
| 7,449,407 B2 | 11/2008 | Lur et al. | |
| 8,471,343 B2 | 6/2013 | Doris et al. | |
| 8,809,937 B2 * | 8/2014 | Kim | H01L 27/11521 257/321 |
| 9,123,714 B2 | 9/2015 | Pachamuthu et al. | |
| 9,589,833 B1 | 3/2017 | Cheng et al. | |
| 9,613,861 B2 | 4/2017 | Anderson et al. | |

(Continued)

*Primary Examiner* — Zandra V Smith
*Assistant Examiner* — John M Parker
(74) *Attorney, Agent, or Firm* — L. Jeffrey Kelly; Ryan, Mason & Lewis, LLP

(57) ABSTRACT

A method for manufacturing a semiconductor device includes forming a plurality of interconnects spaced apart from each other on a substrate. The plurality of interconnects each have an upper portion and a lower portion. In the method, a plurality of spacers are formed on sides of the upper portions of the plurality of interconnects. A space is formed between adjacent spacers of the plurality of spacers on adjacent interconnects of the plurality of interconnects. The method also includes forming a dielectric layer on the plurality of spacers and on the plurality of interconnects. The dielectric layer fills in the space between the adjacent spacers of the plurality of spacers, which blocks formation of the dielectric layer in an area below the space. The area below the space is between lower portions of the adjacent interconnects.

20 Claims, 6 Drawing Sheets

(56) References Cited

U.S. PATENT DOCUMENTS

| | | | |
|---|---|---|---|
| 9,786,760 B1 | 10/2017 | Bonilla et al. | |
| 10,163,792 B2 | 12/2018 | Zhu et al. | |
| 2002/0155693 A1 | 10/2002 | Hong et al. | |
| 2014/0217517 A1* | 8/2014 | Cai | H01L 29/41791 257/401 |
| 2015/0056800 A1 | 2/2015 | Mebarki et al. | |
| 2015/0187696 A1* | 7/2015 | Tsai | H01L 21/76885 257/773 |

* cited by examiner

INTERCONNECTS WITH SPACER STRUCTURE FOR FORMING AIR-GAPS

BACKGROUND

Semiconductor devices are continuously being scaled down to smaller dimensions. As components are scaled down and interconnects are being formed closer together, the parasitic capacitance between the closely spaced interconnects increases, which undesirably reduces circuit speed. Conventional dielectric spacers formed between conducting elements are not able to adequately prevent charge build up and crosstalk at the smaller scales.

Introducing regions of air between interconnects significantly reduces parasitic capacitance and device delay. Conventional methods to introduce such air regions (referred to herein as "air gaps") include forming layers with air gaps between laterally spaced conductive lines by non-conformally depositing a dielectric layer in the space between the conductive lines. The non-conformally deposited dielectric material fills in the space (e.g., is pinched-off) during deposition. However, conventional pinch-off techniques result in deposition of the pinch-off material on sidewalls of the conductive lines, which offsets the capacitance benefits created by the air gaps.

SUMMARY

According to an exemplary embodiment of the present invention, a method for manufacturing a semiconductor device includes forming a sacrificial layer on a substrate, and forming a plurality of trenches in the sacrificial layer. A conductive material is deposited into the plurality of trenches to form a plurality of conductive portions, and a remaining portion of the sacrificial layer is recessed with respect to top surfaces of the plurality of conductive portions. The method further includes forming a plurality of spacers on the recessed remaining portion of the sacrificial layer and on sides of the plurality of conductive portions. A space is formed between adjacent spacers of the plurality of spacers on adjacent conductive portions of the plurality of conductive portions. In the method, the recessed remaining portion of the sacrificial layer is removed and a dielectric layer is deposited on the plurality of conductive portions and on the plurality of spacers. The dielectric layer fills in the space between the adjacent spacers of the plurality of spacers, which blocks deposition of the dielectric layer into an area below the space.

According to an exemplary embodiment of the present invention, a semiconductor device includes a plurality of interconnects disposed on a substrate and spaced apart from each other. The plurality of interconnects each include an upper portion and a lower portion, and a plurality of spacers are disposed on sides of the upper portions of the plurality of interconnects. Adjacent spacers of the plurality of spacers disposed on adjacent interconnects of the plurality of interconnects are separated by a space. A dielectric layer is disposed on the plurality of spacers, wherein the dielectric layer fills in the space between the adjacent spacers of the plurality of spacers. The semiconductor device further includes an air gap in an area below the space. The air gap is between lower portions of the adjacent interconnects.

According to an exemplary embodiment of the present invention, a method for manufacturing a semiconductor device includes forming a plurality of interconnects spaced apart from each other on a substrate. The plurality of interconnects each have an upper portion and a lower portion. In the method, a plurality of spacers are formed on sides of the upper portions of the plurality of interconnects. A space is formed between adjacent spacers of the plurality of spacers on adjacent interconnects of the plurality of interconnects. The method also includes forming a dielectric layer on the plurality of spacers and on the plurality of interconnects. The dielectric layer fills in the space between the adjacent spacers of the plurality of spacers, which blocks formation of the dielectric layer in an area below the space. The area below the space is between lower portions of the adjacent interconnects.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1A:
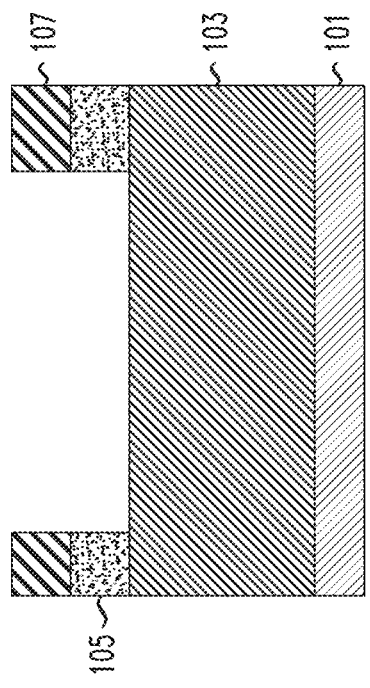
FIG. 1A is a cross-sectional view along a direction perpendicular to a conductive line length and illustrating deposition of a sacrificial layer and formation of hardmask and resist layers to form a trench pattern, according to an exemplary embodiment of the present invention.

Exemplary embodiments of the invention will now be discussed in further detail with regard to semiconductor devices and methods of manufacturing same and, in particular, to using a dielectric spacer at an upper portion of an interconnect structure to block pinch-off material from being deposited on underlying conductive line sidewalls.

It is to be understood that the various layers and/or regions shown in the accompanying drawings are not drawn to scale, and that one or more layers and/or regions of a type commonly used in, for example, field-effect transistor (FET), fin field-effect transistor (FinFET), vertical transport field-effect transistor (VTFET), complementary metal-oxide semiconductor (CMOS), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, FinFETs, VTFETs, CMOSs, nanowire FETs, nanosheet FETs, SETs, and/or MOSFETs. By way of non-limiting example, the semiconductor devices can include, but are not necessarily limited to FET, FinFET, VTFET, CMOS, nanowire FET, nanosheet FET, SET, CMOS and MOSFET devices, and/or semiconductor devices that use FET, FinFET, VTFET, CMOS, nanowire FET, nanosheet FET, SET, CMOS and/or MOSFET technology.

As used herein, "height" refers to a vertical size of an element (e.g., a layer, trench, hole, opening, etc.) in the cross-sectional or three-dimensional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional or three-dimensional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "high-k" refers to dielectric materials having a relative dielectric constant greater than 7.

As used herein, "low-k" refers to dielectric materials having a relative dielectric constant less than 7, and includes ultra-low-k dielectric materials.

In accordance with one or more embodiments, a semiconductor structure is formed which includes air gaps (e.g., vacant areas filled with air) between interconnects. The structures include spacers which face each other on upper portions of adjacent interconnects. A dielectric pinch-off material is non-conformally deposited to fill in a space between the spacers at upper portions of two conductive interconnects. The upper portions can be, for example, via portions of the interconnects. By filling the space between the spacers, the dielectric pinch-off material is blocked from being deposited into a region below the space, and onto lower side walls of the interconnects. As a result, an air gap is formed between lower portions of the interconnects, with minimal or no dielectric pinch-off material being formed on the lower side walls of the interconnects.

Deposition of unwanted material on interconnect sidewalls facing a space between conductive lines is minimized or prevented, which avoids unwanted increases in capacitance caused by dielectric materials covering interconnect sidewalls. The dielectric constant of air (1.00059 at 1 atm) is close to the dielectric constant of a vacuum, which is 1.

Interconnects, also referred to herein as wires or conductive lines, function as conductive contacts or vias. For example, as described further herein, an interconnect may include a via ($V_x$) at an upper portion and contact metal portions at a lower portion forming a metal layer ($M_x$). Interconnects form electrical connections between elements and/or devices, or form contacts to elements or devices. As used herein, an "interconnect" or "interconnect structure" can includes a conductive fill layer, and may further include a barrier layer and/or a liner layer.

Figure 2A:
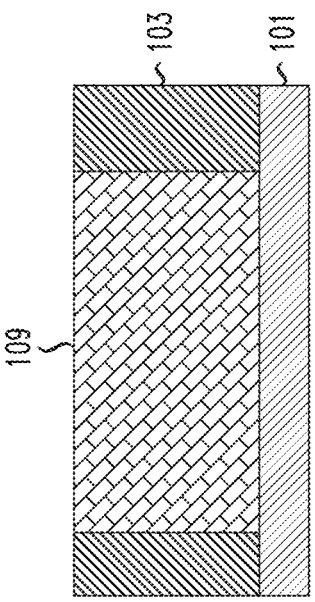
FIG. 2A is a cross-sectional view along a direction perpendicular to a conductive line length and illustrating trench patterning and metal filling and planarization, according to an exemplary embodiment of the present invention.
Figure 2B:
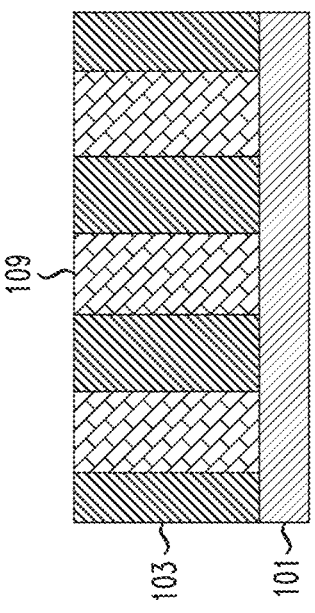
FIG. 2B is a cross-sectional view along a direction parallel to a conductive line length and illustrating trench patterning and metal filling and planarization, according to an exemplary embodiment of the present invention.
Figure 3A:
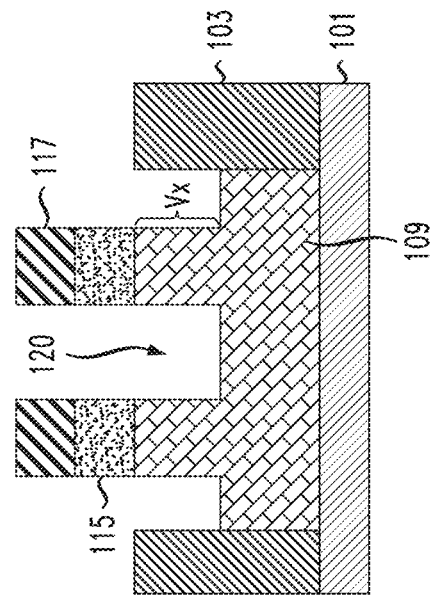
FIG. 3A is a cross-sectional view along a direction perpendicular to a conductive line length and illustrating via patterning, according to an exemplary embodiment of the present invention.
Figure 3B:
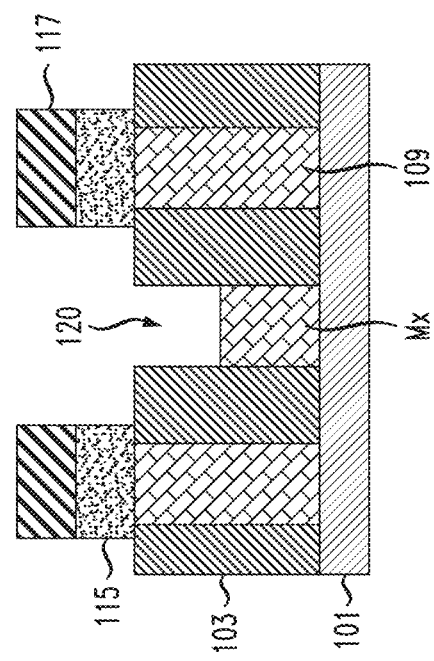
FIG. 3B is a cross-sectional view along a direction parallel to a conductive line length and illustrating via patterning, according to an exemplary embodiment of the present invention.
Figure 4A:
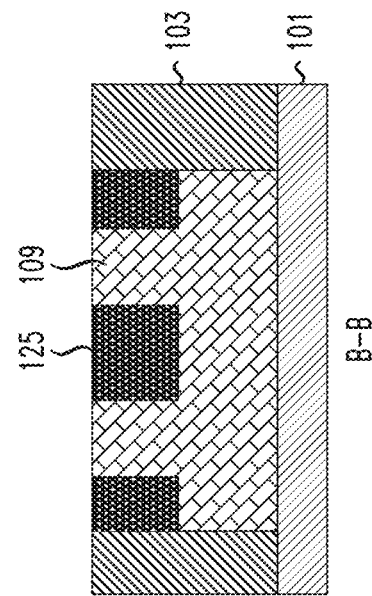
FIG. 4A is a cross-sectional view along a line A-A in FIG. 4C and illustrating via pattern removal and dielectric filling and planarization, according to an exemplary embodiment of the present invention.
Figure 4B:
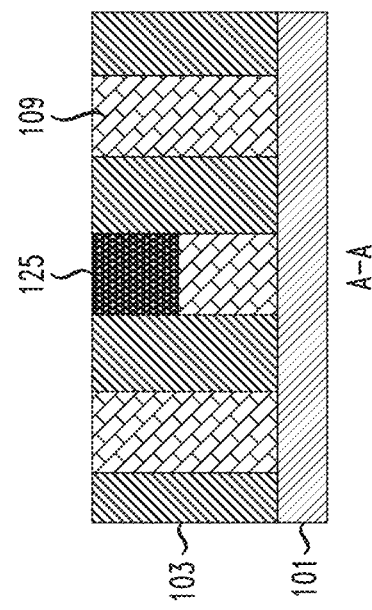
FIG. 4B is a cross-sectional view along a line B-B in FIG. 4C and illustrating via pattern removal and dielectric filling and planarization, according to an exemplary embodiment of the present invention.
Figure 4C:
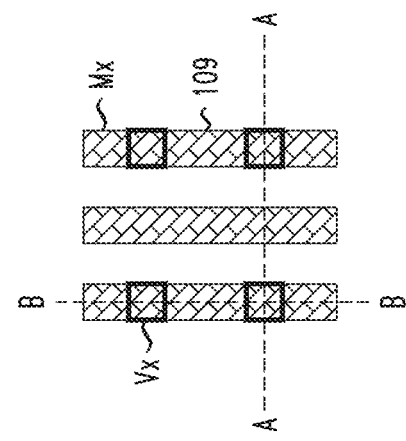
FIG. 4C is a top down view illustrating via pattern removal and dielectric filling and planarization, according to an exemplary embodiment of the present invention.

The cross-sections in FIGS. 1A, 2A, 3A, 4A, 5A, 6A, 7A, 8A and 9A are taken along a direction perpendicular to a conductive line length (e.g., same direction as line A-A in FIG. 4C). The conductive line length is shown in FIG. 4C in the up and down direction (i.e., along line B-B). The cross-sections in FIGS. 1B, 2B, 3B, 4B, 5B, 6B, 7B, 8B and 9B are taken along a direction parallel to a conductive line length (e.g., same direction as line B-B in FIG. 4C).

Figure 1B:
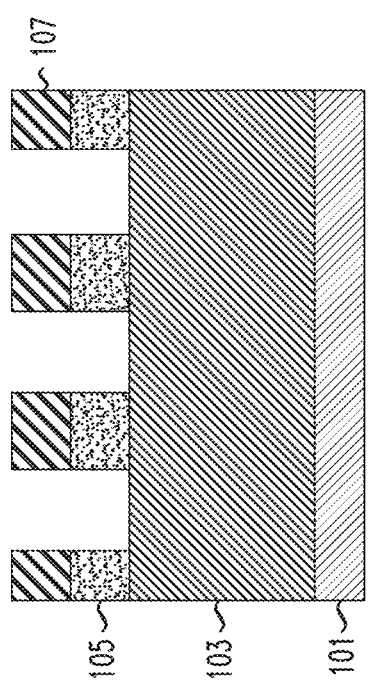
FIG. 1B is a cross-sectional view along a direction parallel to a conductive line length and illustrating deposition of a sacrificial layer and formation of hardmask and resist layers to form a trench pattern, according to an exemplary embodiment of the present invention.

Referring to FIGS. 1A and 1B, a blanket sacrificial layer 103 is formed on a semiconductor substrate 101. A semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-VI compound semiconductor or other like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. A plurality of devices can be on the substrate 101, such as, for example, transistors, capacitors, and resistors.

The blanket sacrificial layer 103 is deposited using a deposition technique including, but not necessarily limited to, chemical vapor deposition (CVD), plasma-enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. According to an embodiment, the blanket sacrificial material comprises, but is not necessarily limited to, titanium nitride (TiN), silicon nitride (SiN) or aluminum oxide (AlOx).

A hardmask layer including, for example, SiN, silicon carbon nitride (SiCN), silicon born nitride (SiBN), or TiN, is formed on the sacrificial layer 105 and patterned into a hardmask pattern including a plurality of hardmask portions 105. The patterning into the hardmask portions 105 can be performed using, a pattern of photoresists 107 leaving exposed portions of the hardmask layer to be removed. The exposed portions of the hardmask layer are etched using, for example, a plasma etching process such as a $CF_4/O_2$ plasma etching.

Then, referring to FIGS. 2A and 2B, exposed portions of the sacrificial layer 103 not covered by the hardmask portions 105 are removed to create a plurality of trenches between remaining portions of the sacrificial layer 103. The exposed portions of the sacrificial layer 103 are etched using, for example, using a plasma etching process such as a $Cl_2/O_2$ plasma etching. Following removal of the hardmask and photoresist portions 105 and 107, the trenches are filled with a conductive fill layer 109, such as, but not necessarily limited to, an electrically conductive metal, such as, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., TiN), transition metal aluminides or combinations thereof. In one or more embodiments, the fill layer 109 is formed on a liner and/or barrier layer. A barrier layer includes, for example, TiN, tantalum nitride or tungsten nitride and is conformally formed on sidewalls and a bottom surface of the trenches in the sacrificial layer 103. A liner layer includes, for example, cobalt and/or ruthenium and is conformally formed on the barrier layer.

The fill layer 109 is deposited using deposition techniques, including, but not necessarily limited to, PVD, CVD, ALD or sputtering. Following deposition of the fill layer 109, a planarization process, such as, for example, chemical mechanical polishing (CMP), is performed to remove portions of the fill layer 109 on the top surface of the remaining portions of the sacrificial layer 103 and extending out of the trenches to planarize an upper surface of the device.

Referring to FIGS. 3A and 3B, hardmask and photoresist portions 115 and 117 similar to hardmask and photoresist portions 105 and 107 discussed in connection with FIG. 1A and FIG. 1B, are formed on the planarized structure from FIGS. 2A and 2B. The hardmask portions 115 may be formed using techniques the same as or similar to those described in connection with the formation of hardmask portions 105. The material of the hardmask portions 115 and photoresist portions 117 can be the same as or similar that of the hardmask portions 105 and photoresist portions 107.

The hardmask portions 115 cover portions of the fill layer 109 and leave exposed other portions of the fill layer 109 according to a desired via pattern. According to an embodiment, the upper portions of the fill layer 109 which are covered by the hardmask portions 115 form vias ($V_x$). The exposed portions of the fill layer 109 which are not covered by the hardmask portions 115 are recessed to a height below the top surface of the remaining portions of the sacrificial layer 103. The recessed portions and lower portions of the fill layer 109 under the vias ($V_x$) form contact portions of a metallization layer ($M_x$). The exposed portions of the sacrificial layer 103 are removed using an etch process such as, for example, a plasma etching process such as a $Cl_2/O_2$ plasma etching.

The recessing of the exposed portions of the fill layer 109 forms vacant areas 120. Referring to FIGS. 4A and 4B, following removal of the hardmask and photoresist portions 115 and 117, the vacant areas 120 are filled with a dielectric layer 125, such as a low-k dielectric layer including, but not necessarily limited to, silicon dioxide ($SiO_2$), carbon-doped silicon oxide (SiCOH), SiLK® dielectrics, porous forms of these low-k dielectric films, flowable dielectrics and/or spin-on dielectrics.

The dielectric layer 125 is deposited using deposition techniques, including, but not necessarily limited to, PVD, CVD, ALD or sputtering. Following deposition of the dielectric layer 125, a planarization process, such as, for example, CMP, is performed to remove portions of the dielectric layer 125 on the top surface of the remaining portions of the sacrificial and fill layers 103 and 109 and extending out of the previously vacant areas 120 to planarize an upper surface of the device.

FIG. 4C is a simplified top view showing the orientation of the conductive fill layers 109 (e.g., interconnects/conductive lines) including the locations of vias ($V_x$). As can be understood, FIG. 4C omits certain elements for ease of explanation. FIGS. 4A and 4B are cross-sectional views taken along the lines A-A and B-B, respectively, in FIG. 4C.

Figure 5A:
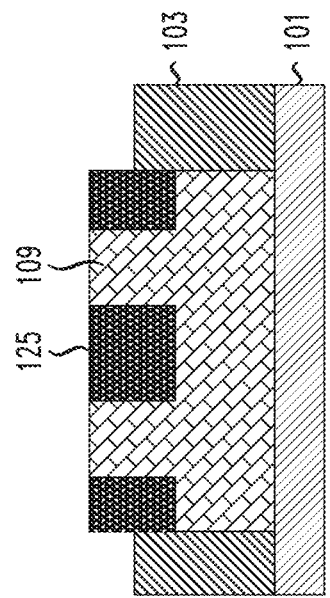
FIG. 5A is a cross-sectional view along a direction perpendicular to a conductive line length and illustrating sacrificial material recessing, according to an exemplary embodiment of the present invention.
Figure 5B:
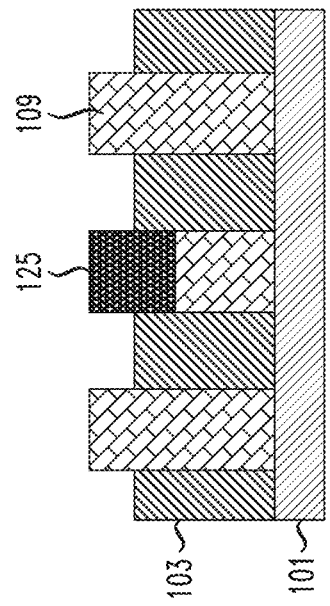
FIG. 5B is a cross-sectional view along a direction parallel to a conductive line length and illustrating sacrificial material recessing, according to an exemplary embodiment of the present invention.

Referring to FIGS. 5A and 5B, the remaining portions of the sacrificial material 103 are recessed to height below the planarized top surfaces of the fill and dielectric layers 109 and 125. The recessing is performed using, for example, a selective wet etch process comprising, for example, ammonium hydroxide, hydrogen peroxide and de-ionized water. The depth of the recess is about 5-about 50% the total height of the fill layer 109.

Figure 6A:
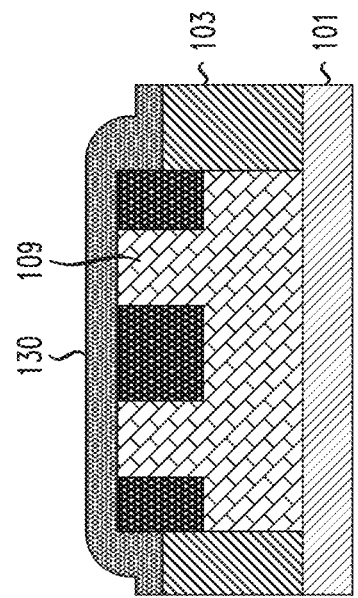
FIG. 6A is a cross-sectional view along a direction perpendicular to a conductive line length and illustrating spacer layer deposition, according to an exemplary embodiment of the present invention.
Figure 6B:
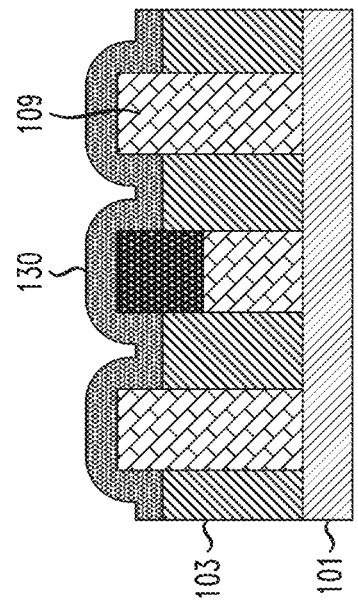
FIG. 6B is a cross-sectional view along a direction parallel to a conductive line length and illustrating spacer layer deposition, according to an exemplary embodiment of the present invention.

Referring to FIGS. 6A and 6B, following recessing of the sacrificial material 103, a dielectric spacer layer 130 is conformally deposited on the structure from FIGS. 5A and 5B. The dielectric spacer layer 130 is deposited using a conformal deposition technique such as, for example, ALD or CVD, and is deposited on and around the portions of the fill and dielectric layers 109 and 125 protruding above the recessed portions of the sacrificial material 103. In addition, the dielectric spacer layer 130 is deposited on the top surfaces of the portions of the sacrificial material 103. The material of the dielectric spacer layer 130 comprises, for example, $SiO_2$, SiCOH and SiCN.

Figure 7A:
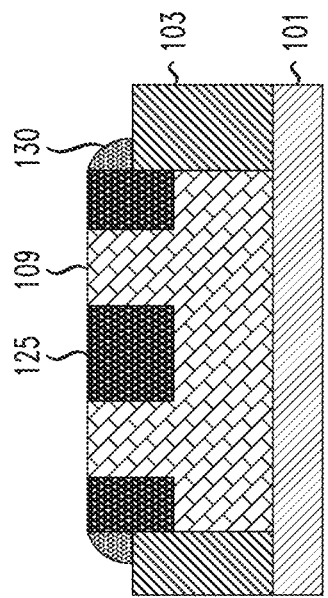
FIG. 7A is a cross-sectional view along a direction perpendicular to a conductive line length and illustrating spacer layer etch back, according to an exemplary embodiment of the present invention.
Figure 7B:
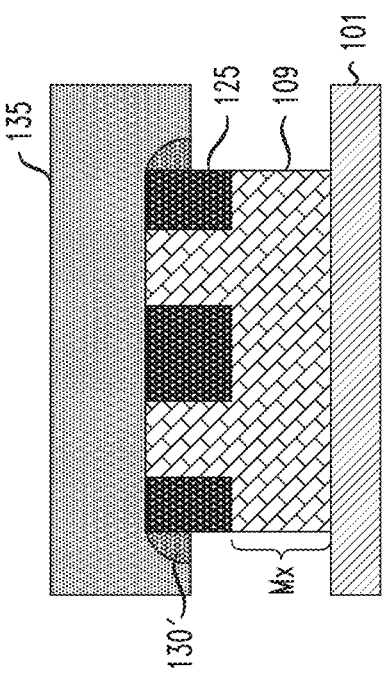
FIG. 7B is a cross-sectional view along a direction parallel to a conductive line length and illustrating spacer layer etch back, according to an exemplary embodiment of the present invention.

Referring to FIGS. 7A and 7B, portions of the dielectric spacer layer 130 are removed in a directional etch back process to leave spacers 130' on the lateral sides of the portions of the fill and dielectric layers 109 and 125 protruding beyond (e.g., to a greater height than) the top surfaces of the remaining portions of the sacrificial material 103. The etch back is performed using, for example, a plasma etching process such as a $CF_4/O_2$ plasma etching.

The spacers 130' are positioned on the sides of the protruding portions of the fill and dielectric layers 109 and 125, as well as on the top surfaces of the remaining portions of the sacrificial material 103. As can be seen in FIG. 7A, there is a space S between adjacent spacers 130' formed on adjacent protruding portions of the fill and/or dielectric layers 109 and/or 125. The space S exposes part of the top surface of the corresponding portion of the sacrificial material 103 on which the spacers 130' are formed. A width of the space S in the horizontal direction is approximately 0.5 nm-approximately 10 nm.

Figure 8A:
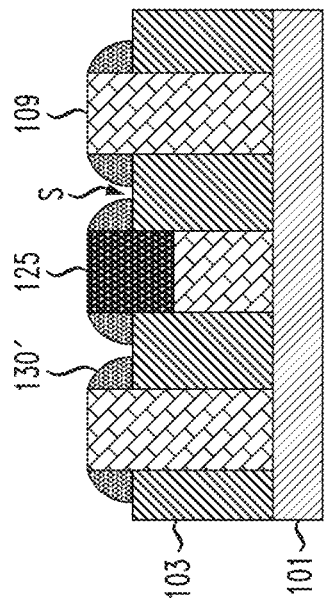
FIG. 8A is a cross-sectional view along a direction perpendicular to a conductive line length and illustrating sacrificial material removal and dielectric layer non-conformal deposition, according to an exemplary embodiment of the present invention.
Figure 8B:
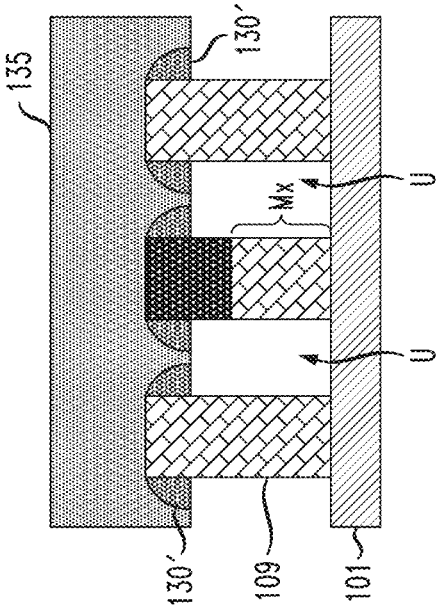
FIG. 8B is a cross-sectional view along a direction parallel to a conductive line length and illustrating sacrificial material removal and dielectric layer non-conformal deposition, according to an exemplary embodiment of the present invention.

Referring to FIGS. 8A and 8B, the remaining portions of the sacrificial material 103 are removed using, for example, a wet etch process with ammonium hydroxide, hydrogen peroxide and de-ionized water. The etchant is introduced and is able to access the remaining portions of the sacrificial material 103 through the spaces S between adjacent spacers 130'. Following removal of the remaining portions of the sacrificial material 103, a dielectric layer 135 comprising, for example, SiCOH, SiN, SiCN, $SiO_2$, or silicon carbide (SiC), is deposited on the spacers 130' and the upper surfaces of the fill and dielectric layers 109 and 125. The dielectric layer 135 can be a high-K material, and may be the same material as or a different material from that of the spacers 130'.

The dielectric layer 135 is deposited using a non-conformal deposition technique, such as, but not necessarily limited to, PECVD, high density plasma CVD (HDP-CVD), CVD, or any suitable combination of those processes. During the non-conformal deposition process, the amount of dielectric material being deposited on the opposing surfaces of adjacent spacers 130' increases to a point where the spaces S are filled-in (e.g., pinch-off). The filled-in spaces S block the dielectric layer 135 from being formed in underlying areas U below the filled-in spaces S, where air gaps are formed instead. Although not shown, there can be additional spacers 130' adjacent the spacers 130' at left and right ends in FIGS. 8A and 8B to create the spaces S between neighboring spacers where pinch-off can occur. Alternatively, there may be some other opposing surface of adjacent the spacers 130' at left and right ends that creates a space that can be filled-in upon non-conformal deposition of the dielectric layer 135. In some embodiments, due to the filling-in of the spaces S, no material of the dielectric layer 135 is deposited into the underlying areas U or on the sidewalls of the portions of the fill layer 109. In other embodiments, a minimal amount of material of the dielectric layer 135 may penetrate into the underlying areas U through one or more of the spaces S before pinch-off occurs. However, such an amount, even if deposited on part of the sidewalls of the portions of the fill layer 109 in the underlying areas U, will have little or no undesirable effects on capacitance.

Figure 9A:
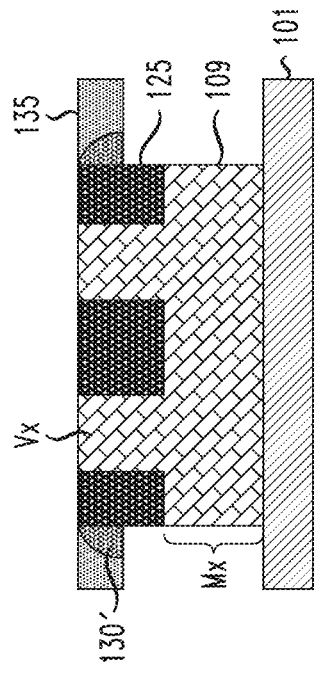
FIG. 9A is a cross-sectional view along a direction perpendicular to a conductive line length and illustrating planarization of the non-conformally deposited dielectric layer, according to an exemplary embodiment of the present invention.
Figure 9B:
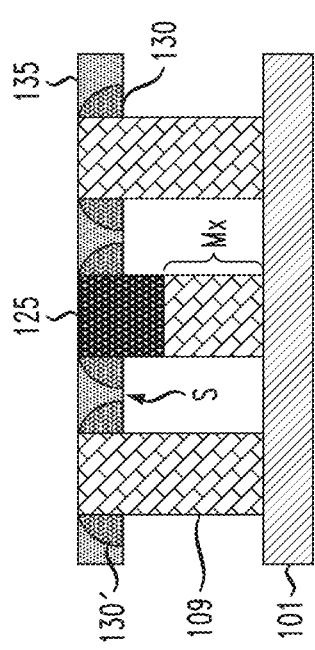
FIG. 9B is a cross-sectional view along a direction parallel to a conductive line length and illustrating planarization of the non-conformally deposited dielectric layer, according to an exemplary embodiment of the present invention.

Referring to FIGS. 9A and 9B, a planarization process, such as, for example, CMP, is performed to remove portions of the dielectric layer 135 on the top surface of the remaining portions of the fill and dielectric layers 109 and 125 to planarize an upper surface of the device.

Figure 10:
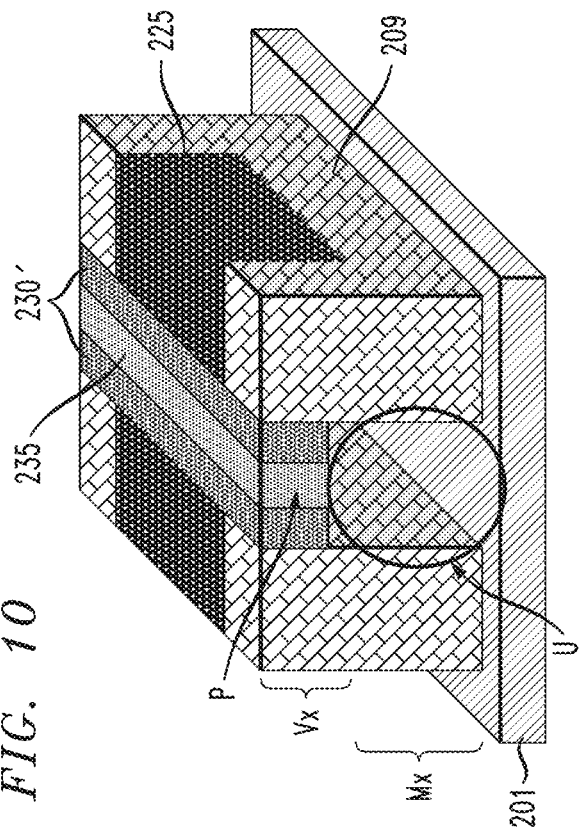
FIG. 10 is a three-dimensional view illustrating a semiconductor device including an air gap between conductive lines, according to an exemplary embodiment of the present invention.

With respect to FIG. 10, similar reference numbers denote the same or similar features, elements, or structures to those described in connection with FIGS. 1A-9B, and a detailed explanation of the same or similar features, elements, or structures has not been repeated. For example, elements 201, 209, 225, 230' and 235 correspond to elements 101, 109, 125, 130' and 135, respectively. The semiconductor device shown in FIG. 10 includes a substrate 201, fill layers 209 including via portions ($V_x$) and contact portions of a metallization layer ($M_x$). The device in FIG. 10 includes dielectric layers 225 between via portions ($V_x$) and filling in areas over recessed portions of the fill layers 209. The device also includes spacers 230' and a dielectric layer 235, which fills in a space between the spacers 230' so as to block deposition of the dielectric layer 235 into the underlying area U. For example, point P in FIG. 10 shows an area where the dielectric layer 235 is pinched-off in the space between the spacers 230'. As a result, an air gap is formed in the circled underlying area U between lower portions of the fill layers 209, and minimal or no material of the dielectric layer 235 is deposited on sidewalls of the lower portions of the fill layer 209 comprising the contact portions of the metallization layer ($M_x$). According to an non-limiting embodiment, a minimal amount of the dielectric layer 235 may have a thickness of about 0.1 nm to about 3 nm.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of trenches in a sacrificial layer;
   depositing a conductive material into the plurality of trenches to form a plurality of conductive portions;
   recessing a remaining portion of the sacrificial layer with respect to top surfaces of the plurality of conductive portions;
   forming a plurality of spacers on the recessed remaining portion of the sacrificial layer and on sides of the plurality of conductive portions, wherein a space is formed between adjacent spacers of the plurality of spacers on adjacent conductive portions of the plurality of conductive portions;
   removing the recessed remaining portion of the sacrificial layer; and
   depositing a dielectric layer on the plurality of conductive portions and on the plurality of spacers;
   wherein the dielectric layer fills in the space between the adjacent spacers of the plurality of spacers, which blocks deposition of the dielectric layer into an area below the space.

2. The method according to claim 1, wherein the area below the space comprises an air gap between the adjacent conductive portions.

3. The method according to claim 1, wherein the area below the space comprises a vacant area formed by the removal of the recessed remaining portion of the sacrificial layer.

4. The method according to claim 1, wherein the dielectric layer is non-conformally deposited on the plurality of conductive portions and on the plurality of spacers.

5. The method according to claim 1, further comprising recessing a conductive portion of the plurality of conductive portions with respect to a top surface of the remaining portion of the sacrificial layer.

6. The method according to claim 5, further comprising depositing an additional dielectric layer on the recessed conductive portion.

7. The method according to claim 6, wherein the plurality of spacers are formed on sides of the additional dielectric layer.

8. The method according to claim 1, wherein the plurality of spacers comprise a dielectric material.

9. The method according to claim 1, wherein forming the plurality of spacers comprises:
   conformally depositing a spacer layer; and
   etching portions of the conformally deposited spacer layer to form the plurality of spacers.

10. The method according to claim 1, wherein the plurality of spacers are formed on an upper portion of each of the plurality of conductive portions.

11. The method according to claim 10, wherein the upper portion is a via.

12. A method for manufacturing a semiconductor device, comprising:
    forming a trench in a sacrificial layer;
    depositing a conductive material into the trench to form a conductive portion;
    recessing a remaining portion of the sacrificial layer with respect to a top surface of the conductive portion;
    forming adjacent spacers on exposed vertical sidewalls of the conductive portion and of an adjacent conductive portion, wherein the adjacent spacers are separated by a space;
    removing the recessed remaining portion of the sacrificial layer; and
    depositing a dielectric layer on the conductive portion and on the adjacent spacers;
    wherein the dielectric layer fills in the space between the adjacent spacers and prevents deposition of the dielectric layer into an area below the space and below the adjacent spacers.

13. The method according to claim 12, wherein the area below the space and below the adjacent spacers comprises an air gap between the conductive portion and the adjacent conductive portion.

14. The method according to claim 12, wherein the area below the space and below the adjacent spacers comprises a vacant area formed by the removal of the recessed remaining portion of the sacrificial layer.

15. The method according to claim 12, wherein the dielectric layer is non-conformally deposited on the conductive portion and on the adjacent spacers.

16. The method according to claim 12, wherein forming the adjacent spacers comprises:
    conformally depositing a spacer layer; and
    etching portions of the conformally deposited spacer layer to form the adjacent spacers.

17. A method for manufacturing a semiconductor device, comprising:
    forming trenches in a sacrificial layer;
    depositing a conductive material into the trenches to form conductive portions;
    recessing the sacrificial layer with respect to top surfaces of the conductive portions;
    forming spacers on exposed vertical sidewalls of the conductive portions, wherein adjacent spacers are separated by a space;
    forming an air gap between adjacent conductive portions by selectively removing a remaining portion of the sacrificial layer; and
    depositing a dielectric layer on the conductive portions and on the spacers;
    wherein the dielectric layer fills the space between the adjacent spacers and prevents deposition of the dielectric layer into an area below the space and below the adjacent spacers; and
    wherein the area below the space and below the adjacent spacers comprises the air gap between the adjacent conductive portions.

18. The method according to claim 17, wherein the dielectric layer is non-conformally deposited on the conductive portions and on the spacers.

19. The method according to claim 17, further comprising recessing a conductive portion of the conductive portions with respect to a top surface of the remaining portion of the sacrificial layer.

20. The method according to claim 19, further comprising depositing an additional dielectric layer on the recessed conductive portion.

\* \* \* \* \*